Feb. 10, 1959 M. G. GOSSARD 2,873,374

ELECTRICAL FINE TUNING DEVICE

Filed May 27, 1955 4 Sheets-Sheet 1

INVENTOR.
M. GLENN GOSSARD

BY

Ostrolenk, Faber, Gerb & Soffen ATTORNEYS

Feb. 10, 1959 M. G. GOSSARD 2,873,374

ELECTRICAL FINE TUNING DEVICE

Filed May 27, 1955 4 Sheets-Sheet 2

INVENTOR.
M. GLENN GOSSARD

BY

Ostrolenk, Faber, Gerb & Soffen
ATTORNEYS

INVENTOR.
M. GLENN GOSSARD
BY
Ostrolenk, Faber, Gerb & Soffen ATTORNEYS

ELECTRICAL FINE TUNING DEVICE

Filed May 27, 1955

4 Sheets-Sheet 4

INVENTOR.
M. GLENN GOSSARD

BY Ostrolenk, Faber, Gerb & Soffen

ATTORNEYS

United States Patent Office 2,873,374

Patented Feb. 10, 1959

2,873,374

ELECTRICAL FINE TUNING DEVICE

Morris Glenn Gossard, Burbank, Calif., assignor to Standard Coil Products Co. Inc., Los Angeles, Calif., a corporation of Illinois Application May 27, 1955, Serial No. 511,642

4 Claims. (Cl. 250—40)

The present invention relates to electrical fine tuning devices, and more particularly relates to a novel fine tuning mechanism for television tuners.

In prior fine tuning devices, particularly for the frequencies used in television reception, the effect of the fine tuning increments of frequency change diminished at one or the other end of the reception band. Furthermore, the range of prior fine tuning devices did not effectively cover the entire reception band, as for example all the twelve very high frequency (V. H. F.) channels. The television band for V. H. F. ranges from 54 to 88 megacycles, encompassing channels 2 to 6; and from 174 to 216 megacycles, encompassing channels 7 through 13. The present invention is directed to novel fine tuning devices effective throughout such frequency range of 54 to 216 megacycles; and beyond, should such be desired.

In accordance with the present invention, an inductance section of the fine tuning device is placed in circuit with the oscillator, and a capacitive element is also incorporated therewith. Novel means are provided whereby both the inductance and the capacity in the fine tuning device are varied to directly affect the frequency of the oscillator. It has been found that the devices of the present invention are effective throughout the twelve V. H. F. channels, at both ends thereof, and in fact is linear in its operation of fine tuning a frequency shift with respect to the operating drive and provides a full range of two megacycles variation for all V. H. F. channels. The devices of the present invention are also usable as an oscillator trimmer, as will be more fully set forth hereinafter.

It is accordingly an object of the present invention to provide a novel fine tuning device effective over a wide frequency spectrum.

Another object of the present invention is to provide a novel fine tuning mechanism effective throughout a wide frequency range in controlling frequency shifts of an oscillator therewith.

A further object of the present invention is to provide a novel fine tuning mechanism incorporating both inductance and capacitance, related to an oscillator circuit, and wherein the parameters of the mechanism are changed by mechanical displacement.

Still another object of the present invention is to provide a novel fine tuning device incorporating an inductive element in circuit with an oscillator circuit, and a capacitance that is changed by mechanical displacement, to effect frequency shifts in the oscillator through parameter changes in the inductance thereof.

Another object of the present invention is to provide a novel fine tuning control that affords a substantially linear fine tuning frequency change effect in an oscillator, over a wide frequency range of operation thereof, as related to mechanical displacements in the fine tuning control.

These and further objects of the present invention will become more apparent in the following description thereof, taken in connection with the drawings in which.

Figures 1, 3:
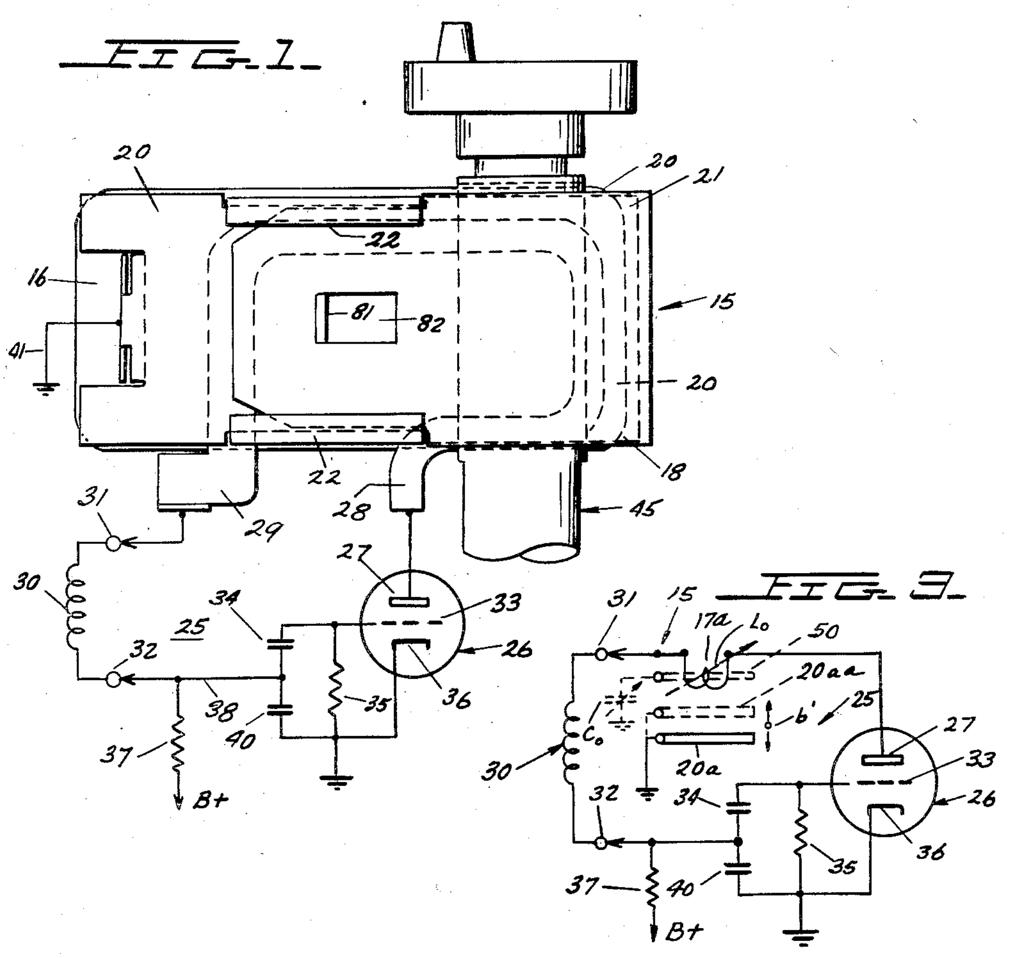
Figure 1 is top view of an exemplary embodiment of the novel fine tuning device, in circuit connection with an oscillator.
Figure 3 is a schematic diagram of the oscillator circuit of Figure 1, incorporating the invention fine tuner.

An exemplary form of the fine tuning device of the invention is shown in circuit with an oscillator in Figure 1. Fine tuning device 15 comprises a base 16 and an inductance loop 17 mounted in a recess 18 within base 16. A spring blade 20 is mounted on the top of base 16, and insulating board 21 is gripped to the top surface of blade 20 by lips 22, 22 on the sides thereof.

The flat loop 17 serves as an inductor in circuit with the oscillator 25. Oscillator 25 comprises a triode electron tube 26, having plate electrode 27 connected to one end 28 of loop 17. The opposite terminal lug 29 of loop 17 is connected to inductance 30 of oscillator 25, at terminal 31 thereof. Terminal 32 of inductance 30 is connected to grid electrode 33 of triode 26 through condenser 34. A self-biasing resistor 35 is connected between grid 33 and cathode 36, to ground. The plate or B+ supply for oscillator 25 is connected to anode 27 through inductance 30 and loop 17, in series therewith through dropping resistor 37 between B+ and lead 38 to terminal 32. A condenser 40 completes the oscillator circuit, connected between lead 38 and ground.

The fine tuning device 15 comprises essentially an inductor corresponding to loop 17 mounted in an insulation base 16, and electrically connected in the inductance circuit of oscillator 25 between inductance 30 and anode 27. The blade 20 is supported above loop 17 in device 15 and is connected to ground through lead 41. Blade 20 is accordingly capacitatively coupled to the flat loop 17, constituting a capacitance between loop 17 and ground.

Figure 2:
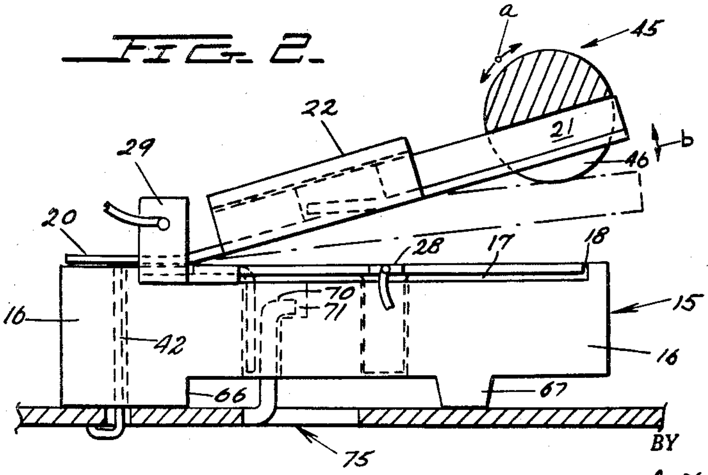
Figure 2 is an end view of the fine tuning device of Figure 1.

The elevational view, Figure 2 of fine device 15 illustrates the normal open position of blade 20 above flat inductance loop 17. Blade 20 is made preferably of a spring material, such as Phosphor bronze, and has a vertical projection 42 set into a groove in base 16. The extended arrangement of blade 20 is in the upwardly biased position (Figure 2), spring-pressed against the full flat 46 in fine tuning shaft 45. The open position of blade 20 in Figure 2, affords the minimum capacitative coupling thereof with inductance loop 17.

The fine tuning shaft 45 extends across the surface of insulation board 21. Tuning shaft 45 is mounted in suitable bearings (not shown), and contains a 180° flat 46 as seen clearly in Figure 2. The relationship of tuning shaft 45 to the fine tuning device 15, in the exemplary embodiment, is shown in dotted lines in Figure 1. Shaft 45 is rotatable in either direction as shown by the arrow *a*. Rotation of shaft 45 causes abutment of the solid 180° portion thereof against insulation plate 21, moving it against the spring action of blade 20. Blade 20 is thereupon pressed angularly closed to base 16, and accordingly to the flat loop 17 therein.

Figure 4:
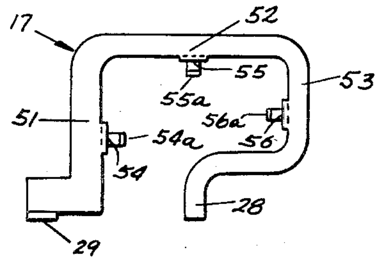
Figure 4 is a plan view of the inductance loop of the fine tuning device of Figure 1.
Figure 5:
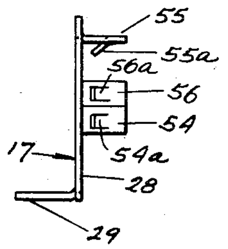
Figure 5 is a side elevation view of the inductance loop of Figure 4.

The up-and-down swing of blade 20 is illustrated by the arrow *b*, in Figure 2. The electrical effect of the angular swing of blade 20 of the fine tuning device 15, is described in more detail in connection with schematic Figure 3 hereinafter. Details of an exemplary construction for the inductance loop 17 are shown in Figures 4 and 5. Further details of the mechanical construction of the fine tuning device 15 as embodied in Figures 1 and 2, are described and illustrated in connection with Figures 6 through 10, hereinafter. It is to be understood that the angular swing of blade 20 may be accomplished by suitable means other than shaft 45.

Figure 3 is a schematic representation of the oscillator 25 of Figure 1, in conjunction with a diagrammatic representation of fine tuning device 15, indicated as 15*a*. The inductor loop 17 is represented by inductance $17^a$, in the series between the anode 27 and inductance 30. The planar embodiment of inductance 17 forms an effective condenser plate, indicated in dotted at 50 for inductance $17^a$. The blade 20 in effect forms a condenser plate $20^a$ of a condenser related to the effective capacity plate 50 of inductor $17^a$. Condenser plate $20^a$ is connected to ground (Figure 3), corresponding to its circuit connection in Figure 1.

Rotation of shaft 45 moves the condenser plate $20^a$, corresponding to blade 20 of Figure 2, for a variable physical relationship and spacing with respect to the effective condenser plate 50. The arrow *b'* of Figure 3 illustrates a relative movement of plate $20^a$ with respect to the effectively fixed plate 50. A definite capacity or condenser $C_0$ is formed by plates $20^a$ and 50. In Figure 3 the effective condenser $C_0$ is shown connected between the inductance $17^a$ (where it joins inductor 30), and ground. Variation of the capacitance of $C_0$ ($20^a$—50) creates a definite change in the frequency at any given setting, with given parameters of oscillator 25, as will be understood by those skilled in the art.

Still another important electrical effect accrues from the invention fine tuning device. It has been found that by changing the position of blade 20 with respect to inductor loop 17, an effective change occurs also in the inductance of loop 17. Such variation in the effective inductance $17^a$ of schematic Figure 3, is indicated by variable $L_0$. It is thus now apparent that the fine tuning device 15 of the invention comprises an inductance (17) connectable in circuit with an electronic oscillator (25), and contains a variable capacity element ($C_0$) that also changes effectively the inductance ($L_0$) of the device. The composite fine tuning device 15 is simple, inexpensive and effective throughout the tuning range of, for example, a V. H. F. tuner.

It has been found that device 15 is operative such that for the lower V. H. F. channels (namely channels 2 to 6 with frequency range of 54 to 88 megacycles), the change of capacitance $C_0$ by relative spacings of blade 20 to flat inductor loop 17 is effective to shift the frequency of oscillator 25; while for the higher channels (namely in the 174 to 216 megacycle range of channels 7 to 13), the capacity effect is less important for the frequency shifts than the change of the inductance ($L_0$) in the oscillator through the effective inductance $17^a$. Such action in effect results in decreasing inductance $L_0$ when the frequency of the oscillator 25 is in the higher range to compensate or otherwise negative the corresponding increase of capacitance $C_0$, when blade 20 approaches coil 17.

It is to be understood that where the device 15 is used in a television tuner, that the oscillator (25) is tuned to frequencies above (or below) the corresponding carrier frequencies of the channels to afford a best frequency output as the intermediate frequency (I. F.) for the receiver. It is also understood that the device 15 for fine tuning oscillator 25 raises (or lowers) the pretuned oscillator basis setting frequency through shaft 45 for the fine resolution tuning of the receiver.

The net effect of the frequency change in oscillator 25 by such composite action of $C_0$ and $L_0$ in device 15 is the same as to automatically place smaller capacity changes for the higher frequencies. Otherwise a given capacity change in a high frequency oscillator results in a greater shift or change of frequency in the oscillator, than the same capacity change would produce in a lower frequency oscillator. It has been found that the device 15 of the invention affords approximately equal displacements (shifts) of frequency throughout the twelve channels for given angular rotation of the drive 45 in a V. H. F. television receiver. The effective operation of device 15 as a variable trimmer condenser $C_0$ primarily in the lower band of the V. H. F. frequencies, and the reduction of the $C_0$ capacitance by a corresponding $L_0$ decrease effective in the higher frequencies of the V. H. F. band, provides the novel uniform frequency shifting or fine tuning action for reception of each channel.

It is to be understood that the device 15 of the invention is applicable to other frequency bands than V. H. F. channels in television. It is useful also, for example, in frequency modulation broadcasting in ultra-high frequency (U. H. F.) television broadcasting, and in other forms and ranges of communication. The exemplary device is described for V. H. F. broadcasting for purposes of illustration.

An exemplary flat loop construction corresponding to 17 of Figures 1 and 2 is shown in Figures 4 and 5, being plan end and elevational views respectively. The loop 17 is of metallic material, such as half-hard brass, 26 gauge. In a particular embodiment, the inside rectangular dimension of loop 17 was 0.3" by 0.6", with the effective linear width of the loop 17 of the order of .06". Each of three arms 51, 52, and 53 of loop 17 contains a depending lug 54, 55, 56 that fits into a corresponding notch or groove in insulation base 16. Each of the lugs 54, 55, 56 contains a spring-flat projection $54^a$, $55^a$, $56^a$, that locks into notches of base 16 to be described. Thus the loop 17 is flat and set into a recess in the base 16, and rigidly mounted in the base through the lugs 54, 55, 56 integral therewith. Electrical connection to inductance loop 17 is made through the end terminals 28, 29 as aforesaid.

Figure 6:
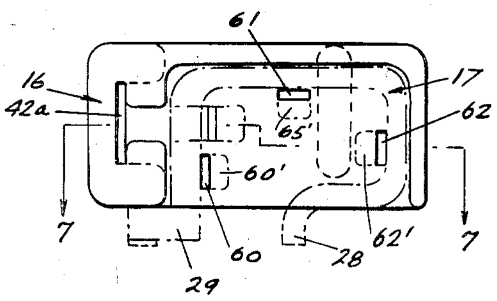
Figure 6 is a top view of the mounting base of the fine tuning device.
Figure 7:
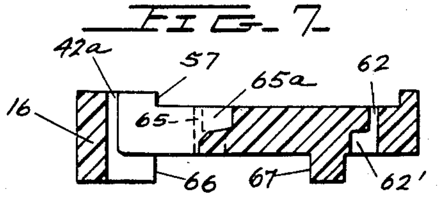
Figure 7 is a cross-sectional view through the base of Figure 6, taken along the line 7—7 thereof.

The plastic base 16 for device 15 is detailed in Figures 6 and 7. The top plan view of base 16 is shown with loop 17 recessed therein. The recessed portion of the base 16 corresponding to the groove 57 in the top of the base. The material for base 16 may be a moldable material such as Plascon Alkaloid #430, polystyrene, Lucite, or other suitable material of low dielectric constant. Base 16 contains the three notches or slots 60, 61 and 62 within which the depending lugs 54, 55, 56 of loop 17 are set. The under portions of the notches 60, 61, 62, namely 60', 61', and 62', are undercut in order to receive the spring projections $54^a$, $55^a$, and $56^a$, and hold loop 17 fast to base 16, in predetermined recess 57 thereof.

The recess $42^a$ at the left side of base 16, is for the projection 42 of blade 20, seen in Figure 2. A further cavity 65 having a recess $65^a$ is seen in Figures 6 and 7. The purpose of the cavity-recess $65—65^a$ is to receive a hook 70 (indicated in Figure 2) that is punched out from the base 75 upon which the fine tuning device is secured. The base 75 may be the metallic chassis of the tuner or equipment with which the fine tuning device is connected. The integral projections 66 and 67 constitute the base feet of the mounting base 16 of device 15. Tip 71 of hook 70 grips base 16 at the recess $65^a$ thereof, through a sliding action, to mount device 15 against the panel 75. Device 15 remains against panel 75, held in position in a relatively rigid relationship. In the exemplary embodiment, the overall dimensions of the base 16 were 1" long, ½" wide, and about ¼" overall height.

The depth of loop recess 57 in base 16 in the described embodiment was .03", corresponding to about twice the thickness of the loop 17. In this manner electrical contact between loop 17 and the blade 20 co-acting therewith is avoided in all instances. The device 15 accordingly acts with only capacitive and inductive changes in the elements thereof under all operating conditions, without actual or sliding contacts.

Figure 8:
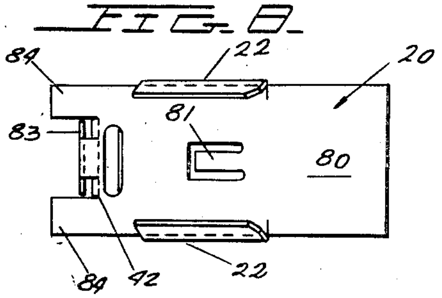
Figure 8 is a top view of the blade element of the fine tuning device.
Figure 9:
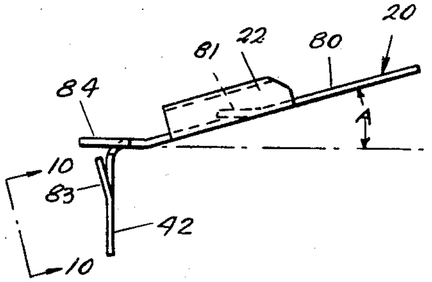
Figure 9 is a front elevational view of the blade of Figure 8.
Figure 10:
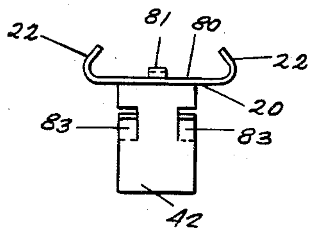
Figure 10 is an end elevational view of the blade as seen from the right side of Figure 9.

Figures 8, 9 and 10 are exemplary illustrations of spring-capacitive blade 20 of fine tuning device 15. The blade 20 contains body 80, with a depending leg 42. The leg 42 is mounted within the recess $42^a$ of base 16, as aforesaid. The material of blade 20 in the exemplary embodiment was of Phosphor bronze, .010" thick. This is to afford a spring action of body 80 of blade 20 for the purposes set forth. The lips 22, 22 extending from body 80 of blade 20 are for gripping the insulation board 21 to the top of blade 20 as shown in Figure 2.

A projection 81 from blade body 80 recesses in the opening 82 of insulation member 21. Projection 81 prevents longitudinal displacement of the board 21 on blade 20, otherwise gripped by the opposed lips 22, 22. The leg 42 has projecting lugs 83, 83 stamped therein to co-act with a corresponding notch or groove in the vertical recess $42^a$ of base 16; whereby the blade 20 is held in operative position on base 16.

The body 80 of blade 20 is designed to be set at an angle (A) with the horizontal base 16 of the order of 15°; more or less, as desired. Lugs 84, 84 extend from the back end of body 80 and rest upon top of the base 16, and contribute to the spring action of blade 20. In the preferred embodiment, the overall dimensions of blade 20 is comparable to those of the top face of mounting base 16 upon which it operates. In a typical case, the length of leg 42 was on the order of one-third inch.

The ready simplicity and assemblage of device 15 will now be apparent. Inductance loop 17 is designed to be inserted into mounting base 16 in recess 57 thereof, and locked into position through its depending integral lugs 54, 55, 56. Capacitive blade 20 is similarly locked into base 16 through leg 42 thereof, and its extending lug 83. Insulation plate 21 is fastened to blade 20 through lips 22, 22 and held in position by lug 81. The assembled fine tuning device 15 is mounted to chassis plate 75, through projecting hook 70, affording a rigid mounting of the device. The fine tuning shaft 45, having recess 46, operates the device 15 connected in the oscillator 25 circuit. It is to be understood that the exemplary tuning device 15, illustrated in Figures 1 to 10 herein, has been shown for illustrative purposes, and that modifications thereof for effecting the novel results herein, will now be apparent to those skilled in the art, without departing from the broad spirit and scope of the invention.

Figure 11:
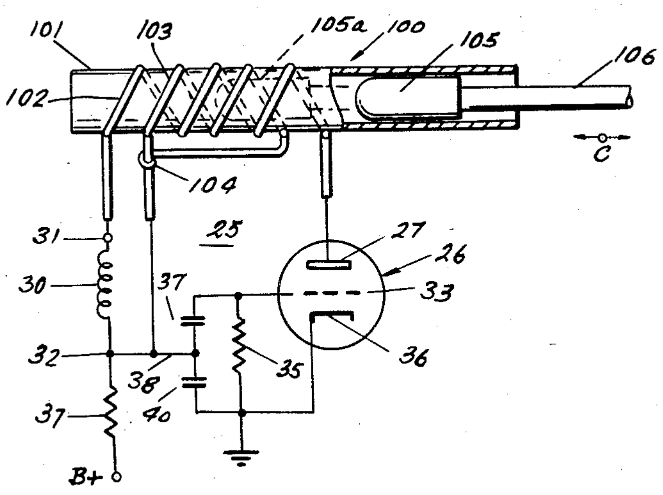
Figure 11 is an elevational view of a modified fine tuning device, partially broken away, and in circuit with an oscillator.
Figure 12:
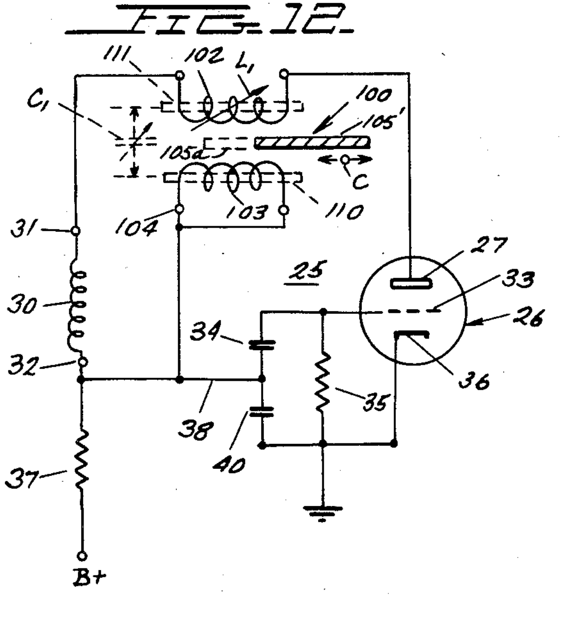
Figure 12 is a schematic electrical representation of the system of Figure 11.

A modified form for a fine tuning mechanism within the scope of the present invention is illustrated in Figures 11 and 12 at 100. Reference is made to Figure 11, wherein a cylindrical insulation tube 101 is provided with bifilar windings 102, 103, connected to an oscillator circuit 25 similar to that of Figures 1 and 3. Fine tuning device 100 contains a coil, 102 in connection between terminal 31 of inductance 30 and anode 27 of oscillator 25. The winding of coil 102 are spaced and accommodates the other coil 103 between its windings, in the form of a bifilar arrangement.

Coil 103 is connected end to end at terminal 104 and in turn is connected to lead 38 of oscillator 25. It is to be understood that various connections of the fine tuning device 100, as of device 15, are feasible within the exemplary oscillator circuit 25 or in any other electronic oscillator used instead, without departing from the spirit or principles of the invention. The circuit connections shown herein are merely for exemplary purposes. The coil 103 is accordingly capacitatively related to the inductance 102 for the purposes to be set forth.

A metallic slug 105 is slidable within coil form 101 through a rod 106 in the longitudinal back-and-forth relationship shown by arrow *c*. The position of slug 105 can be varied fully within the extent of the interior of the windings 102, 103 as shown at $105^a$. Material for slug 105 is preferably brass but may be of aluminum or other suitable metallic material. The movement of slug 105 to within bifilar coils 102, 103 by rod 106 causes an increase in the capacitance between these two windings. Such movement of slug 105 within coil 102 also serves to reduce the inductance thereof effective in oscillator 25. The result is an equalization in the range of fine tuning of the device 100, in a similar manner to that of device 15 hereinabove described.

Reference is made to Figure 12 which is a schematic representation of fine tuning device 100 in circuit with oscillator 25. The winding 102 is in series connection between inductance 30 of the oscillator and the anode 27 thereof. The winding 103, wound in the interstices of the spaced winding of coil 102, is connected end-to-end at point 104, and serves effectively as a capacity plate, shown at 110, through coil 103. The turns of inductance 102 effectively form anoother capacity plate 111, to coact with the capacity plate effective at 110. A capacity $C_1$, shown in dotted, is accordingly effected between the bifilar related windings 102, 103 at the frequencies encountered in oscillator circuit 25, herein.

The brass slug 105' in Figure 12 is movable between the effective capacity plates 110, 111 in the longitudinal relationship corresponding to arrow *c'*. An intermediate position of the slug 105' between plates 110, 111 is shown at position $105^a$. The movement of the slug 105' to in between the effective condenser plates of windings 102, 103 (corresponding to plates 110, 111) causes an increase in the capacity between the plates 110, 111. Such capacitance ($C_1$) changes by movements of slug 105 correspondingly shifts the frequency of oscillator 25, as will now be understood by those skilled in the art.

As the frequency of oscillator 25 is increased, e. g., for the higher channels in the V. H. F. range, the effective inductance 102 is decreased at these higher frequencies due to the presence of the brass slug $105^a$ therein (see also Figure 11). As will now be understood, reducing the inductance at 102, corresponding to variable $L_1$, in conjunction with the increase in capacitance $C_1$ as the brass slug is at the fuller inside position $105^a$, provides for the higher frequencies an overall lower capacitance effect for the frequency changes at the oscillator. The overall band for the V. H. F. channels has been found to be provided, with device 100, a relatively linear effect with slug 105 travel.

The frequency changes (shifts) provided over the overall twelve channels in the V. H. F. band are substantially the same for each channel throughout the band, using the invention device in the oscillator of a tuner.

The mechanism 100 may be used as an oscillator trimmer as well. In such application the slug 105 is moved to a position in tube 101 corresponding to the approximate frequency setting for oscillator 25 desired. Variation of such position, through external action on rod 106, effects trimming frequency shifts in oscillator 25.

Figures 13, 14, 15, 16:
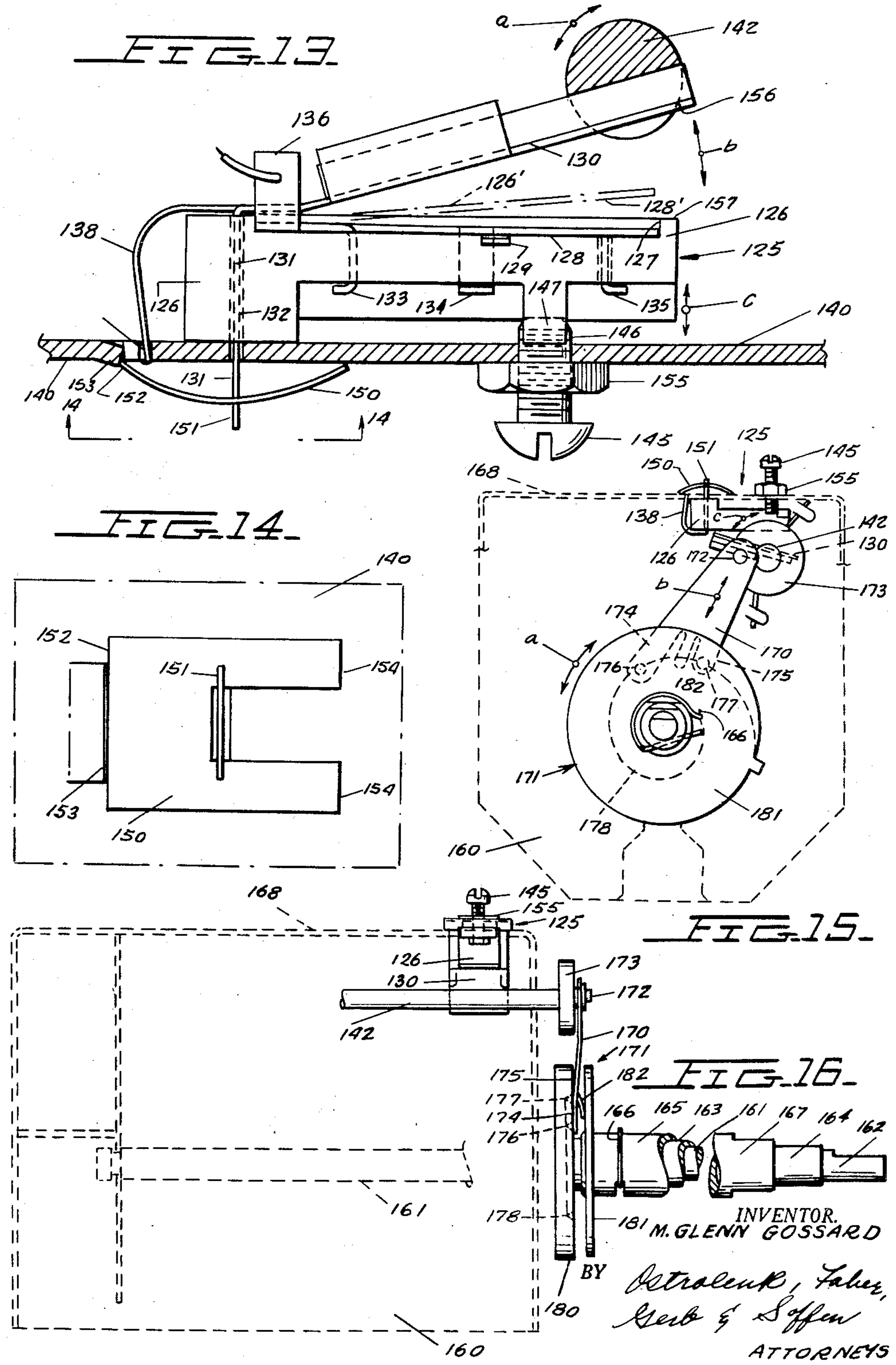
Figure 13 is an end view of a further embodiment of a fine tuning device in accordance with the present invention.
Figure 14 is a bottom view of a portion of the device of Figure 13 as seen at the arrows 14—14 thereof.
Figure 15 is an end elevational view of a television tuner incorporating the fine tuning device of Figure 13.
Figure 16 is a side elevational view of the tuner of Figure 15.

A further exemplary embodiment of the fine tuning device 15, corresponding to Figures 1 and 2, is illustrated in Figure 13. The tuning unit 125 is basically constructed like device 15 in that it has an insulation base 126 with a recess 127 in which the flat inductance loop 128 is supported, and the capacitance blade 130 is angularly mounted thereon with its leg 131 projecting through recess 132 in base 126.

Loop 128 is secured to base 126 by clips 133, 134, 135. Circuit connection to loop 126 is made to end projecting lip 136 and the opposite end 137 thereof. A projecting arm 138 of blade 130 extends beyond base 126, and electrically grounds blade 130 to metallic chassis or base 140 such as by soldering at opening 141.

Base 126 of device 125 is tiltably mounted on base 140, being adjustable with respect to control cam 142. The adjustable mounting means for the fine tuning device 125 comprises an adjusting screw 145 projecting through chassis 140 to mechanically co-act at its end portion 146 with a portion 147 of base 126, and a retaining spring 150 engaging leg 132 at notched end 151 thereof and abutting chassis base 140. Spring 150 is arcuate and of flat material. As seen in Figures 13 and 14, one edge 152 of rectangular retaining spring 150 abuts a knock-out lip 153 of chassis 140. The edge of spring 150 opposite edge 150 comprises two legs 154, 154 pressed in spring fashion against chassis 140.

In operation, fine tuning device 125 is controlled in its frequency shifting or changing function by the rotation of cam shaft 142 in either direction *a*, to move blade 130 angularly with respect to normally stationary inductance loop 128 along *b* as described in connection with Figures 1 and 2.

In accordance with the features of fine tuning device 125, the further adjustment thereon by adjusting screw 145 controls the actual effective range of displacement between loop 128 and blade 130 through control 142. Rotation of screw 145 causes base 126 to move to or from chassis 140 along the direction per arrow *c*. A displacement to the dotted position of the base at 126′ and the inductance loop at 128′ results from motivation of screw end 146 upwardly. Since the positions of movement of capacitive blade 130 are defined by the fixed cam shaft 142, a new position as 128′ of loop 128, closer to blade 130 at all its movements results in a greater maximum capacitance action due to a closer angular position of blade 130 to loop 128, as will now be understood.

Thus a greater or lesser overall effect in the frequency control by device 125, in an oscillator circuit such as oscillator 25 of Figure 1, is adjusted as desired or required by setting adjusting screw 145. Screw 145 is locked in its set position by lock-nut 155. Retaining spring 150 serves to hold device 145 stably on chassis 140 in all adjusted positions.

In a physical embodiment of device 145 as used in a V. H. F. tuner oscillator circuit, the minimum spacing between the outside end 156 of blade 130 and the opposite end 157 of base 126 was 0.050″ when the base 126 was in its lowest position in Figure 13 as shown in solid lines. Adjustment by adjusting screw 145 of base 126 upwardly to the maximum extent, such as shown at dotted base-top position 157′, caused the lowest position of blade tip 157 to contact base 126 at 157′, and effect the maximum capacitive correlation between blade 130 and loop 128. However, this is given by example and other parameter values may be used in practice.

Figures 15 and 16 illustrate an exemplary tuner 160 contruction embodying the fine tuning device 125 of Figure 13. Tuner 160 comprises main tuning shaft 161 (for V. H. F.) shown in dotted lines internally of the tuner, and having a flattened end 162 for a knob. A further shaft 163 is concentric about shaft 161 and may be used for U. H. F. frequency control, or omitted in a V. H. F.-only tuner. The extending flattened end 164 of shaft 163 is for a knob (not shown). The outer tubular shaft 165 is the fine tuning shaft, rotatably secured on inner shaft 163 by clip 166, and having flattened end 167 for a knob. The shaft 165 controls the fine tuning of the tuner 160, usually at its oscillator circuit by actuating the device 125 in circuit therewith and mounted on the chassis 168 of the tuner 160.

The fine tuning device 125 is basically shielded within tuner 160 and has its adjusting screw 145 and lock-nut 155 projecting; as does retaining spring 150 securing lip 151. Screw-nut 145, 155 (when set) and spring 150 hold device 125 securely in position whereby its spring blade 130 co-acts with and is movable by cam shaft 142. Also see Figure 13.

Rotation of cam shaft 142 is effected by fine tuning shaft 165 through cam lever 170 operating in spiral cam unit 171 at one end and on pin 172 of disc 173 at the other end. Cam shaft 142 is suitably mounted in tuner 160 and is rotatable by action of cam lever 170 on pin 172 on the disc 173 secured to shaft 142.

Cam lever 170 has two fingers 174, 175 with corresponding projections 176, 177 arranged to engage a spiral slot 178 in plate 180 of mechanism 171. A spring finger 182 of lever 170 presses against plate 181 spacedly mounted opposite plate 180, and holds lever 170 in operative position between plates 180, 181. Plate 181 is secured to tuning shaft 165 and in turn rotates plate 180 to displace cam lever 170 through the projections 176, 177 thereof riding in spiral slot 178.

Rotation in either direction, arrow *a* causes radial displacement *b* of lever 170 to in turn result in corresponding rotational displacement of disc 173 per arrow *c* in Figure 15. The fine tuning by device 125 for tuner 160 is thus accomplished by operation of fine tune shaft 165, as will now be understood by those skilled in the art.

It is to be understood that the invention described herein is subject to further variation and modification without departing from its function and operation, all within the broadest spirit and scope of the invention as defined in the appended claims.

I claim:

1. A fine tuning device of the character described for an osciliator tunable over a wide frequency range comprising an inductive member constructed in a plane and connectable in the oscillator circuit, a body of insulation material carrying the plane inductive member parallel to a flat surface thereof, a blade of spring material supported at one end in said body at an angle above said member and surface, said blade being capacitatively related to said inductive member and angularly displaceable with respect thereto about said one end through biased juxtapositioning of its other end, against a cammed control member whereby the oscillator frequency is varied by said control member.

2. A fine tuning device as claimed in claim 1, wherein said plane inductive member is in the form of a single loop with integral clip means projecting therefrom for coacting with corresponding areas of said body to hold said loop firmly in position.

3. A fine tuning device as claimed in claim 1, in which said blade has an integral prong extending from its said one end through said body and out at the base thereof opposite said surface for securing the device to a chassis portion.

4. A fine tuning device as claimed in claim 2, in which said loop is mounted in a recess of said body below its said flat surface and said blade is of sufficient area to subtend the rim of said recess and thereby limit the minimum distance between said blade and loop.

(References on following page)

References Cited in the file of this patent

UNITED STATES PATENTS

| | | |
|---|---|---|
| 1,596,391 | Bell | Aug. 17, 1926 |
| 1,647,474 | Seymour | Nov. 1, 1927 |
| 2,222,387 | Wheeler | Nov. 19, 1940 |
| 2,341,345 | Van Billiard | Feb. 8, 1944 |
| 2,475,637 | Vladimir | July 12, 1949 |
| 2,521,963 | Beusman | Sept. 12, 1950 |
| 2,555,520 | Torre | June 5, 1951 |
| 2,601,338 | Snyder | June 24, 1952 |
| 2,693,581 | Osborn | Nov. 2, 1954 |
| 2,795,700 | Julian | June 11, 1957 |